US008514641B2

(12) United States Patent
Cui et al.

(10) Patent No.: US 8,514,641 B2
(45) Date of Patent: Aug. 20, 2013

(54) REPAIR CIRCUIT AND REPAIR METHOD OF SEMICONDUCTOR APPARATUS

(75) Inventors: Xiang Hua Cui, Ichon-shi (KR); Jeong Woo Lee, Ichon-shi (KR); Sang Hoon Shin, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 423 days.

(21) Appl. No.: 12/840,231

(22) Filed: Jul. 20, 2010

(65) Prior Publication Data

US 2011/0156034 A1 Jun. 30, 2011

(30) Foreign Application Priority Data

Dec. 24, 2009 (KR) ........................ 10-2009-0130756

(51) Int. Cl.
*G11C 7/00* (2006.01)

(52) U.S. Cl.
USPC ........... 365/200; 365/174; 365/201; 257/774; 257/529

(58) Field of Classification Search
USPC .................. 365/200, 174, 201; 257/774, 529
See application file for complete search history.

(56) References Cited

U.S. PATENT DOCUMENTS 6,259,637 B1 7/2001 Wood et al.
7,317,256 B2 1/2008 Williams et al.
7,598,523 B2 10/2009 Luo et al.
2008/0315388 A1 12/2008 Periaman et al.
2009/0020865 A1 1/2009 Su
2009/0134500 A1 5/2009 Kuo
2009/0166873 A1 7/2009 Yang et al.
2010/0060310 A1* 3/2010 Laisne et al. .................... 326/10
2010/0295600 A1* 11/2010 Kim et al. ..................... 327/365
2011/0309519 A1* 12/2011 Kim ............................. 257/774

FOREIGN PATENT DOCUMENTS

KR 100375997 B1 3/2003
KR 1020030042065 A 5/2003
KR 1020090034785 A 4/2009
KR 101038996 B1 5/2011

OTHER PUBLICATIONS

Uksong Kang et al., "8Gb 3D DDR3 DRAM Using Through-Silicon Via Technology", 2009 IEEE International Solid-State Circuits Conference, ISSCC 2009/Session 7/DRAM/7.2, Digest of Technical Papers, Feb. 10, 2009, pp. 130-132.

* cited by examiner

*Primary Examiner* — Vu Le
*Assistant Examiner* — Han Yang
(74) *Attorney, Agent, or Firm* — William Park & Associates Patent Ltd.

(57) ABSTRACT

A repair circuit of a semiconductor apparatus includes a plurality of through-silicon vias including repeated sets of one repair through-silicon via and an M number of normal through-silicon vias; a transmission unit configured to multiplex input data at a first multiplexing rate based on control signals, and transmit the multiplexed data to the plurality of through-silicon vias; a reception unit configured to multiplex signals transmitted through the plurality of through-silicon vias at a second multiplexing rate based on the control signals, and generate output data; and a control signal generation unit configured to generate sets of the control signals based on an input number of a test signal.

10 Claims, 3 Drawing Sheets

100
500
510
520
Counter
Decoder
TM
TM<0:3>
CT<0:11>
200
210
220
230
240
250
260
MUX
CT0
CT11
CT1
CT3
CT2
CT4
CT5
CT6
CT7
CT9
CT8
CT10
GIO0'
GIO1'
GIO2'
GIO3'
A
B
C
D
E
F
RTSV
TSV
300
310
320
330
340
CT0 CT1 CT2
CT3 CT4 CT5
CT6 CT7 CT8
CT9 CT10 CT11
GIO0
GIO1
GIO2
GIO3

FIG.4

| TM Input Number | A | B | C | B | C | D | D | E | F | E | F | A | TSV Fail |
|---|---|---|---|---|---|---|---|---|---|---|---|---|---|
| 0 | | 1 | | | 1 | | | 1 | | | 1 | | default |
| 1 | 1 | | | | 1 | | | 1 | | | 1 | | B fail |
| 2 | | 1 | | | | 1 | | 1 | | | 1 | | C fail |
| 3 | | 1 | | | 1 | | 1 | | | | 1 | | E fail |
| 4 | | 1 | | | 1 | | | 1 | | | | 1 | F fail |
| 5 | 1 | | | 1 | | | | 1 | | | 1 | | C,D fail |
| 6 | | | 1 | | | 1 | | 1 | | | 1 | | A,B fail |
| 7 | | 1 | | | 1 | | 1 | | | 1 | | | A,F fail |
| 8 | | 1 | | | 1 | | | | 1 | | | 1 | D,E fail |
| 9 | 1 | | | | | 1 | | 1 | | | 1 | | B,C fail |
| 10 | | 1 | | | | 1 | | 1 | | | | 1 | C,F fail |
| 11 | 1 | | | | 1 | | 1 | | | | 1 | | B,E fail |
| 12 | | 1 | | | 1 | | 1 | | | | | 1 | E,F fail |
| 13 | 1 | | | 1 | | | 1 | | | | 1 | | C,E fail |
| 14 | | | 1 | | | 1 | | 1 | | | | 1 | B,F fail |
| 15 | 1 | | | | 1 | | 1 | | | 1 | | | B,F fail |

CT<0:11>

REPAIR CIRCUIT AND REPAIR METHOD OF SEMICONDUCTOR APPARATUS

CROSS-REFERENCES TO RELATED APPLICATION

The present application claims priority under 35 U.S.C. §119(a) to Korean Application No. 10-2009-0130756, filed on Dec. 24, 2009, in the Korean Intellectual Property Office, which is incorporated herein by reference in its entirety as if set forth in full.

BACKGROUND

1. Technical Field

The present invention relates to a semiconductor apparatus, and more particularly, to a repair circuit and a repair method of a semiconductor apparatus.

2. Related Art

In order to enhance the degree of integration of a semiconductor apparatus, a three-dimensional semiconductor apparatus has been developed. In a three-dimensional semiconductor apparatus, a plurality of chips are stacked in a single package. On the other hand, a TSV (through-silicon via) type semiconductor apparatus has been recently disclosed in the art, in which silicon vias are formed through a plurality of stacked chips so that all the chips are electrically connected to one another.

The three-dimensional semiconductor apparatus has a plurality of TSVs so that the plurality of stacked chips can commonly receive various signals. However, various defects may occur in relation with the TSVs. For example, the defects may include voids created due to incomplete filling of conductive material in the TSVs, bump contact failures caused by warpage of the chips or the migration of bump material, cracks in the TSVs themselves, etc.

Since the TSVs electrically connect the plurality of chips together, if a defect occurs and a TSV is disconnected due to the defect, the TSV cannot properly perform its function. Therefore, a repair process for replacing the defective TSV with a normal TSV is required.

SUMMARY

In one embodiment of the present invention, a repair circuit of a semiconductor apparatus includes: a plurality of through-silicon vias including one repair through-silicon via and an M number of normal through-silicon vias which are repeatedly disposed; a transmission unit configured to multiplex input data at a first multiplexing rate based on control signals, and transmit the multiplexed data to the plurality of through-silicon vias; a reception unit configured to multiplex signals transmitted through the plurality of through-silicon vias at a second multiplexing rate based on control signals, and generate output data; and a control signal generation unit configured to generate the control signals based on an input number of a test signal.

In another embodiment of the present invention, a repair circuit of a semiconductor apparatus includes: a plurality of through-silicon vias including repeated sets of one repair through-silicon via and two normal through-silicon vias; a transmission unit configured to multiplex sets of 4-bit input data at a multiplexing rate of 2:1 based on control signals, and transmit resultant input data to the plurality of through-silicon vias; a reception unit configured to multiplex signals transmitted through the plurality of through-silicon vias at a multiplexing rate of 3:1 based on the control signals, and generate 4-bit output data; and a control signal generation unit configured to generate sets of control signals based on an input number of a test signal, wherein a failed through-silicon via is replaced with a through-silicon via that is adjacent in number to the failed through-silicon via, based on the control signals.

In another embodiment of the present invention, a repair method of a semiconductor apparatus including a plurality of through-silicon vias including repeated sets of one repair through-silicon via and two normal through-silicon vias, includes: determining whether a logic value of data outputted during a test is equal to a target logic value and if a through-silicon via has failed; and replacing a failed through-silicon via with a repair through-silicon via that is adjacent to the failed through-silicon via.

BRIEF DESCRIPTION OF THE DRAWINGS

Features, aspects, and embodiments are described in conjunction with the attached drawings, in which:

FIG. 4 is a view illustrating changes in control signals and signal transmission paths for when a TSV fails.

DETAILED DESCRIPTION

Hereinafter, a repair circuit and a repair method of a semiconductor apparatus based on the present invention will be described below with reference to the accompanying drawings through exemplary embodiments.

Figure 1:
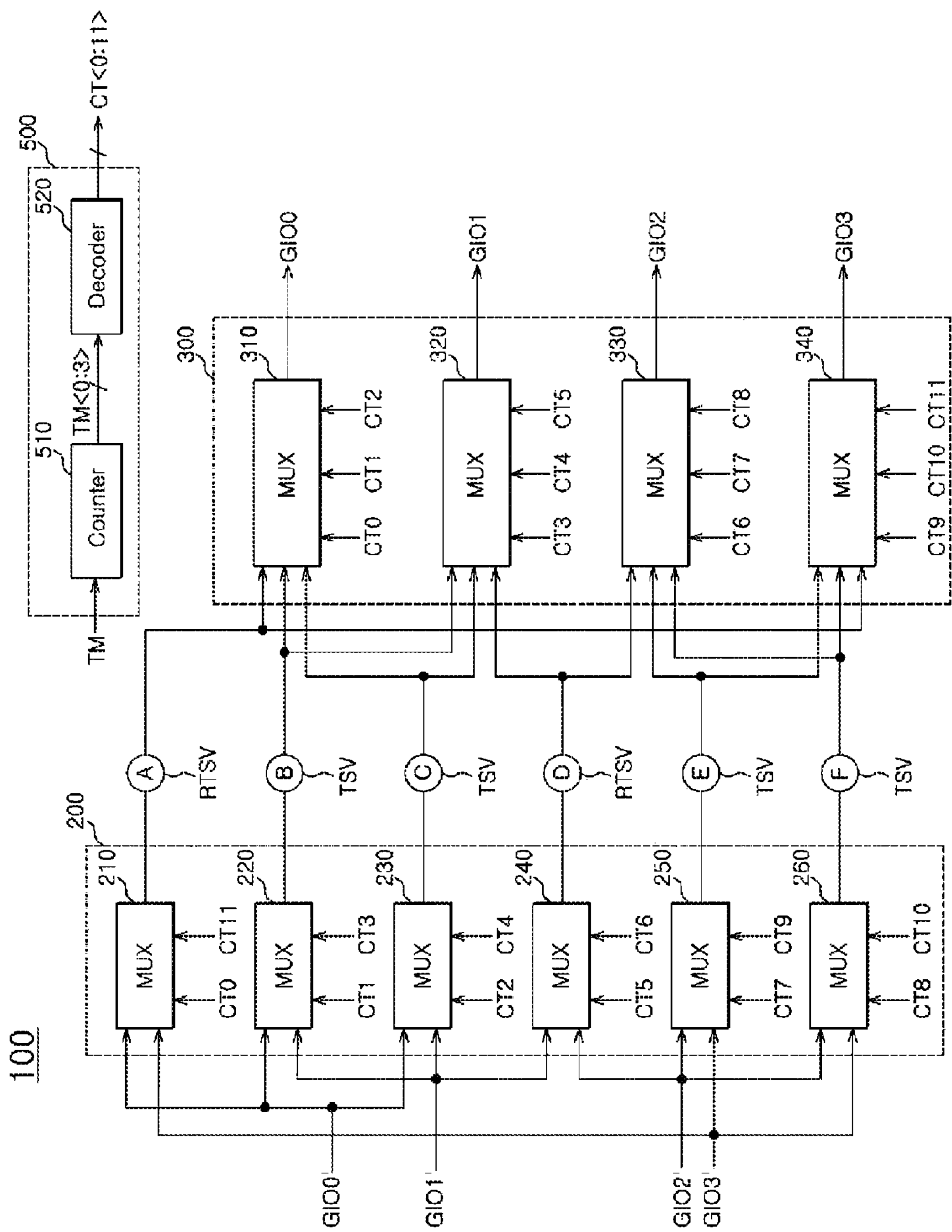
FIG. 1 is a block diagram illustrating a repair circuit of a semiconductor apparatus in accordance with an embodiment of the present invention.

FIG. 1 is a block diagram illustrating a repair circuit of a semiconductor apparatus in accordance with an embodiment of the present invention. Referring to FIG. 1, a repair circuit 100 of the semiconductor apparatus in accordance with the embodiment includes a plurality of through-silicon vias A-F, a transmission unit 200, a reception unit 300, and a control signal generation unit 500.

The plurality of through-silicon vias A-F include normal through-silicon vias (TSV) B, C, E and F and repair through-silicon vias (RTSV) A and D.

The repair through-silicon vias A and D are used to replace through-silicon vias that have failed from among the normal through-silicon vias B, C, E and F.

The plurality of through-silicon vias A-F are disposed so that two out of the total six through-silicon vias may be used to repair normal through-silicon vias. An exemplary, one repair through-silicon via is allocated for an M number of (for example, two) normal through-silicon vias, and one repair through-silicon via and two normal through-silicon vias are repeatedly disposed.

The transmission unit 200 is configured to multiplex input data GIO0'-GIO3', each composed of a plurality of bits at a first multiplexing rate, for example, 2:1, based on control signals CT<0:11> composed of a plurality of bits, and transmit resultant data to the plurality of through-silicon vias A-F.

The transmission unit 200 includes a plurality of multiplexers (MUX) 210-260. The output terminals of the plurality of multiplexers 210-260 are coupled with the plurality of through-silicon vias A-F in a one-to-one correspondence.

The multiplexer 210 is configured to select one of input data GIO0' and GIO3', based on the control signals CT0 and CT11, and transmit selected data to the through-silicon via A.

The multiplexer 220 is configured to select one of its assigned input data GIO0' and GIO1', based on the control signals CT1 and CT3, and transmit selected data to the coupled through-silicon via B.

The multiplexer 230 is configured to select one of its assigned input data GIO0' and GIO1', based on the control signals CT2 and CT4, and transmit selected data to the coupled through-silicon via C.

The multiplexer 240 is configured to select one of its assigned input data GIO1' and GIO2', based on the control signals CT5 and CT6, and transmit selected data to the coupled through-silicon via D.

The multiplexer 250 is configured to select one of its assigned input data GIO2' and GIO3', based on the control signals CT7 and CT9, and transmit selected data to the coupled through-silicon via E.

The multiplexer 260 is configured to select one of its assigned input data GIO2' and GIO3', based on the control signals CT8 and CT10, and transmit selected data to the coupled through-silicon via F.

The reception unit 300 is configured to multiplex the signals transmitted through the plurality of through-silicon vias A-F at a second multiplexing rate, for example, 3:1, based on the control signals CT<0:11>, and generate output data GIO0-GIO3.

The reception unit 300 includes a plurality of multiplexers 310-340.

The multiplexer 310 is configured to select the signal transmitted through one of the coupled through-silicon vias A, B and C, based on the control signals CT0, CT1 and CT2, and generate the output data GIO0.

The multiplexer 320 is configured to select the signal transmitted through one of the coupled through-silicon vias B, C and D, based on the control signals CT3, CT4 and CT5, and generate the output data GIO1.

The multiplexer 330 is configured to select the signal transmitted through one of the coupled through-silicon vias D, E and F, based on the control signals CT6, CT7 and CT8, and generate the output data G102.

The multiplexer 340 is configured to select the signal transmitted through one of the coupled through-silicon vias E, F and A, based on the control signals CT9, CT10 and CT11, and generate the output data G103.

The control signal generation unit 500 is configured to generate a set of the control signals CT<0:11> based on the input number of a test signal TM, such that different signal transmission paths from the transmission unit 200 to the reception unit 300 can be selected.

The different signal transmission paths are established in advance in order to enable repair in case a failure occurs in the normal through-silicon vias B, C, E and F.

The control signal generation unit 500 includes a counter 510 and a decoder 520.

The counter 510 is configured to count the test signal TM and generate count signals TM<0:3>.

The decoder 520 is configured to decode the count signals TM<0:3> and generate the control signals CT<0:11>.

The plurality of multiplexers 210-260, which constitute the transmission unit 200, can be configured in the same way.

Figure 2:
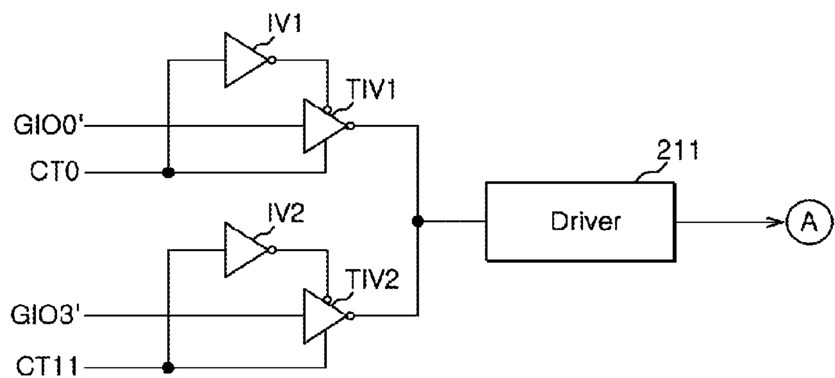
FIG. 2 is a circuit diagram illustrating a multiplexer shown in FIG. 1.

FIG. 2 is a circuit diagram illustrating a multiplexer shown in FIG. 1. Referring to FIG. 2, the multiplexer 210 among the plurality of multiplexers 210-260 includes a plurality of inverters IV1 and IV2, a plurality of tri-state inverters TIV1 and TIV2, and a driver 211.

The multiplexer 210 can pass one of the input data GIO0' and GIO3' or prevent the input data GIO0' and GIO3' from being inputted thereto, based on the levels of the control signals CT0 and CT11.

For example, when the control signal CT0 has a high level, the input data GIO0' is transmitted to the driver 211 through the tri-state inverter TIV1.

When both the control signals CT0 and CT11 have a low level, the input data GIO0' and GIO3' are prevented from being inputted to the multiplexer 210.

The signals having passed through the tri-state inverters TIV1 and TIV2 are driven through the driver 211.

A through-silicon vias has characteristics that its capacitance value is large and resistance value is small. Accordingly, the driver 211 is provided to drive the input data GIO0' and GIO3' such that the input data GIO0' and GIO3' can be stably transmitted through the through-silicon via A.

The plurality of multiplexers 310-340, which constitute the reception unit 300, can be configured in the same way.

Figure 3:
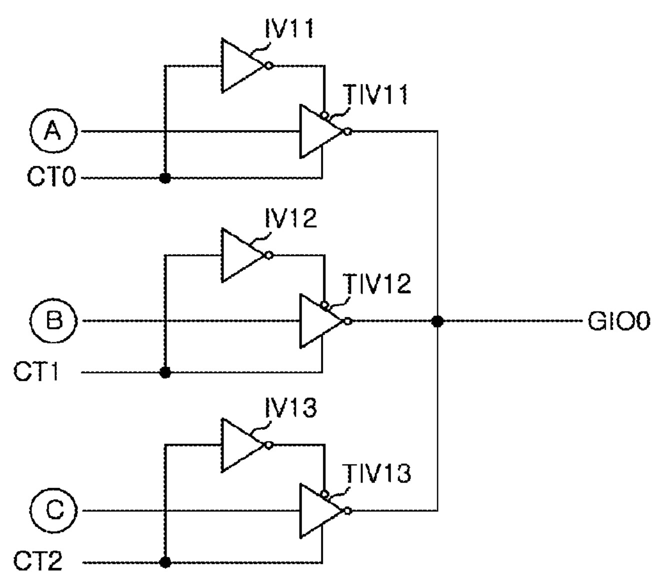
FIG. 3 is a circuit diagram illustrating another multiplexer shown in FIG. 1.

FIG. 3 is a circuit diagram illustrating another multiplexer shown in FIG. 1. Referring to FIG. 3, the multiplexer 310 among the plurality of multiplexers 310-340 includes a plurality of inverters IV1-IV13 and a plurality tri-state inverters TIV11-TIV13.

The multiplexer 310 can pass one of the signals transmitted through the through-silicon vias A, B and C and generate the output data GIO0, or can prevent the signals transmitted through the through-silicon vias A, B and C from being inputted thereto, based on the levels of the control signals CT0, CT1 and CT2.

For example, when the control signal CT0 has a high level, the multiplexer 310 passes the signal transmitted through the through-silicon via A and generates the output data GIO0.

When all of the control signals CT0, CT1 and CT2 have a low level, all of the signals transmitted through the through-silicon vias A, B and C are not inputted to the multiplexer 310.

Operations of the repair circuit of a semiconductor apparatus in accordance with the embodiment of the present invention, configured as mentioned above, will be described below.

As mentioned above, the plurality of through-silicon vias A-F include six through-silicon vias, two of which serve as repair through-silicon vias. As an exemplary, one repair through-silicon via is allocated for two normal through-silicon vias, and one repair through-silicon via and two normal through-silicon vias are repeatedly disposed.

In an embodiment of the present invention, signal transmission paths are established in such a manner that the input data GIO0'-GIO3' are transmitted through the normal through-silicon vias B, C, E and F when no failure occurs in the normal through-silicon vias B, C, E and F.

Through-silicon vias that have failed are replaced with the previously and subsequently numbered repair through-silicon vias A and D, which are disposed adjacent thereto.

The normal through-silicon via B can be replaced with the repair through-silicon via A, the normal through-silicon via C can be replaced with the repair through-silicon via D, the normal through-silicon via E can be replaced with the repair through-silicon via D, and the normal through-silicon via F can be replaced with the repair through-silicon via A.

Different signal transmission paths are established such that the normal through-silicon vias can be replaced with repair through-silicon vias as described above.

FIG. 4 is a view illustrating changes in control signals and signal transmission paths for when a TSV fails. Referring to FIG. 4, different signal transmission paths are established when through-silicon vias fail, and sets of the control signals CT<0:11> are established for the different signal transmission paths. The sets of the control signals CT<0:11> can be selected by controlling the input number of the test signal TM. The sets of control signals CT<0:11> are determined by respective input numbers of the test signal TM, and in conformity with this, the logic design of the decoder 520 of the control signal generation unit 500 shown in FIG. 1 is implemented.

In the embodiment of the present invention, by controlling the input number of the test signal TM, a signal transmission path capable of replacing a currently failed through-silicon via can be selected.

For example, in the case where one normal through-silicon via B is determined to have failed, a signal transmission path is defined such that the input data GIO0' is outputted as the output data GIO0 through the multiplexer 310 by passing through the previously numbered repair through-silicon via A, which is disposed adjacent to the normal through-silicon via B.

Failure determination of a through-silicon via is implemented by determining whether the logic value of the data outputted during a test is equal to a target logic value.

Since the normal through-silicon via B has failed, the test signal TM is inputted one time (see FIG. 4).

As the test signal TM is inputted one time, the logic value of the control signals CT<0:11> that are generated in the control signal generation unit 500 becomes '100010010010'.

The logic values of the control signals CT0, CT4, CT7 and CT10 are '1'.

Because the logic values of the control signals CT0, CT4, CT7 and CT10 are '1', the multiplexers 210, 230, 250 and 260 select the input data GIO0'-GIO3' and transmit selected input data GIO0'-GIO3' to the through-silicon vias A, C, E and F.

Since all the control signals CT1, CT3, CT5 and CT6 have logic values of '0', signal input to the multiplexers 220 and 240 is prevented.

Because the logic values of the control signals CT0, CT4, CT7 and CT10 are '1', the multiplexers 310-340 select the signals transmitted through the through-silicon vias A, C, E and F and generate the output data GIO0-GIO3.

In another example, in the case where two normal through-silicon vias B and C are determined to have failed, signal transmission paths are defined such that the input data GIO0' and GIO1' are outputted as the output data GIO0 and GIO1 through the multiplexers 310 and 330 by passing through the previously and subsequently numbered repair through-silicon vias A and D, which are disposed adjacent to the normal through-silicon vias B and C.

Since the two normal through-silicon vias B and C have failed, the test signal TM is inputted nine times (see FIG. 4).

As the test signal TM is inputted nine times, the logic value of the control signals CT<0:11> that are generated in the control signal generation unit 500 becomes '100001010010'.

The logic values of the control signals CT0, CT5, CT7 and CT10 are '1'.

Because the logic values of the control signals CT0, CT5, CT7 and CT10 are '1', the multiplexers 210, 240, 250 and 260 select the input data GIO0'-GIO3' and transmit selected input data GIO0'-GIO3' to the through-silicon vias A, D, E and F.

Since all the control signals CT1, CT2, CT3 and CT4 have logic values of '0', signal input to the multiplexers 220 and 230 is prevented.

Because the logic values of the control signals CT0, CT5, CT7 and CT10 are '1', the multiplexers 310-340 select the signals transmitted through the through-silicon vias A, D, E and F and generate the output data GIO0-GIO3.

While certain embodiments have been described above, it will be understood to those skilled in the art that the embodiments described are by way of example only. Accordingly, the repair circuit and the repair method of a semiconductor apparatus described herein should not be limited to the described embodiments. Rather, the repair circuit and the repair method of a semiconductor apparatus described herein should be viewed in light of the claims that follow when taken in conjunction with the above description and accompanying drawings.

What is claimed is:

1. A repair circuit of a semiconductor apparatus, comprising:

a plurality of through-silicon vias including one repair through-silicon via and an M number of normal through-silicon vias which are repeatedly disposed;

a transmission unit configured to multiplex input data at a first multiplexing rate based on control signals, and transmit the multiplexed data to the plurality of through-silicon vias;

a reception unit configured to multiplex signals transmitted through the plurality of through-silicon vias at a second multiplexing rate based on control signals, and generate output data; and a control signal generation unit configured to generate the control signals based on an input number of a test signal, wherein all the one repair through-silicon vias are configured to replace any one of a previously numbered failed through-silicon via and a subsequently numbered failed through-silicon via by the transmission unit and the reception unit based on the control signals.

2. The repair circuit according to claim 1, wherein all of repeatedly disposed two failed through-silicon vias are configured to be repaired by two repair through-silicon vias based on the control signals.

3. The repair circuit according to claim 1, wherein the control signal generation unit comprises:

a counter configured to count the test signal and generate a count signal; and a decoder configured to decode the count signal and generate the control signals.

4. The repair circuit according to claim 1, wherein the transmission unit comprises a plurality of multiplexers that are configured to drive, through an internal driver, and output the multiplexed signals.

5. The repair circuit according to claim 1, wherein the reception unit comprises a plurality of multiplexers which have the same number as the normal through-silicon vias among the plurality of through-silicon vias.

6. The repair circuit according to claim 1, wherein the plurality of through-silicon vias includes repeated sets of one repair through-silicon via and two normal through-silicon vias.

7. A repair circuit of a semiconductor apparatus, comprising:

a plurality of through-silicon vias including repeated sets of one repair through-silicon via and two normal through-silicon vias;

a transmission unit configured to multiplex sets of 4-bit input data at a multiplexing rate of 2:1 based on control signals, and transmit resultant input data to the plurality of through-silicon vias;

a reception unit configured to multiplex signals transmitted through the plurality of through-silicon vias at a multiplexing rate of 3:1 based on the control signals, and generate 4-bit output data; and a control signal generation unit configured to generate sets of control signals based on an input number of a test signal, wherein all the one repair through-silicon vias are configured to replace any one of a previously numbered failed through-silicon via and a subsequently numbered failed through-silicon via by the transmission unit and the reception unit based on the control signals.

8. The repair circuit according to claim 7, wherein the control signal generation unit comprises:

is a counter configured to count the test signal and generate a count signal; and a decoder configured to decode the count signal and generate the control signals.

9. The repair circuit according to claim 7, wherein the transmission unit comprises a plurality of multiplexers, which are configured to drive, through an internal driver, and output the multiplexed signals.

10. A repair method of a semiconductor apparatus including a plurality of through-silicon vias including repeated sets of one repair through-silicon via and two normal through-silicon vias, the method comprising:

determining whether a logic value of data outputted during a test is equal to a target logic value and if a through-silicon via has failed; and replacing a failed through-silicon via with a repair through-silicon via that is adjacent to the failed through-silicon via, wherein the replacement step comprises the step of:

replacing the failed through-silicon via with first numbered through-silicon via when the failed through-silicon via is last numbered through-silicon via.

* * * * *